(12) United States Patent
Stein et al.

(10) Patent No.: US 7,791,329 B2
(45) Date of Patent: Sep. 7, 2010

(54) VECTOR/SIGNAL ANALYZER EQUALIZATION APPARATUS AND METHOD

(75) Inventors: Anatoli B. Stein, Atherton, CA (US);
Semen Volfbeyn, Milpitas, CA (US);
Vladislav Klimov, San Jose, CA (US);
Sergey Konshin, Mountain View, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 294 days.

(21) Appl. No.: 11/944,076

(22) Filed: Nov. 21, 2007

(65) Prior Publication Data

US 2009/0128123 A1   May 21, 2009

(51) Int. Cl.
*G01R 23/00* (2006.01)
(52) U.S. Cl. .................. 324/76.19; 324/620; 455/67.11
(58) Field of Classification Search .................. 324/620, 324/76.19; 455/226.1, 67.11, 226.2
See application file for complete search history.

(56) References Cited

U.S. PATENT DOCUMENTS 4,287,469 A * 9/1981 Harzer .......................... 324/620
4,774,454 A * 9/1988 Yamaguchi et al. ......... 324/623

* cited by examiner

*Primary Examiner*—Vincent Q Nguyen
(74) *Attorney, Agent, or Firm*—Pierce Atwood, LLP; Joseph M. Maraia

(57) ABSTRACT

Disclosed is a method of equalization of a vector/signal analyzer including: providing a structured test signal within a selected frequency range. The structured test signal includes a plurality of frequency components each having a respective amplitude and phase. The method includes inputting the test signal to the analyzer; the analyzer operating to condition the test signal; determining information representative of frequency distortion of the conditioned test signal introduced by the analyzer; generating a set of equalization coefficients based on the information representative of the frequency distortion, the set of coefficients corresponding to the selected frequency range; and storing the set of equalization coefficients and the correspondence of the set of coefficients to the selected frequency range.

35 Claims, 5 Drawing Sheets

VECTOR/SIGNAL ANALYZER EQUALIZATION APPARATUS AND METHOD

BACKGROUND

The present disclosure relates to the correction of the frequency response and especially of the phase frequency distortions in the vector/signal analyzers or in the similar devices, where the input and output signals are in different frequency ranges.

Wireless networking systems have become a prevalent means in the communication industry. In such systems it is very important to measure/analyze with a high degree of accuracy the various properties of a transmitted/received modulation signal. Therefore a large and perpetually increasing demand exists for high precision RF vector/signal analyzers.

A typical block diagram of a vector/signal analyzer is shown in FIG. 1. The input signal is conditioned by down converter 100 and analog to digital converter (ADC) 101. The down converter 100 transfers the part of the input signal spectrum to be analyzed to the operational frequency range of the ADC 101. The ADC 101 transforms incoming continuous signal into a sequence of digital samples. After this conditioning, a processor 102 carries out the necessary analysis of the properties of the processed signal with the presentation of the received results at the display 103.

It is important for the down converter 100 not to create spurious responses, which may substantially distort the processed signal. To attain such a purpose, a conventional down converter contains usually several conversion stages (three or four) with an appropriate selection of the local oscillators frequencies. At each conversion stage a filter is used to separate out the desired frequency components. These filters inevitably introduce frequency distortions in the processed signal. To achieve a high degree of measurement accuracy in a vector/signal analyzer it is necessary to compensate the frequency distortions that emerge in the down converter 100.

The known methods of frequency responses measurement are based on a comparison of the output signal of the device under test with the input signal or with a duplicate of the input signal. Such an approach can be used to find the amplitude frequency distortions in a vector/signal analyzer. However, since the input and the output frequency ranges of the down converter 100 are different, it is impossible to compare the phases of sine wave components in the input signal and output signal: the difference between the phases varies in time continuously.

SUMMARY

The inventors have realized that frequency distortion of a signal, introduced by the conditioning (e.g. down-conversion and/or analog to digital conversion) of the signal in a vector/signal analyzer, can be measured and equalized using methods and apparatuses of the type disclosed herein. Such measurement and equalization can improve the performance of vector/signal analyzers used in, for example, wireless networking applications.

In one aspect, disclose herein is a method of equalization of a vector/signal analyzer including: (a) providing a structured test signal within a selected frequency range, the structured test signal including a plurality of frequency components each having a respective amplitude and phase; (b) inputting the test signal to the analyzer; the analyzer operating to condition the test signal; (c) determining information representative of frequency distortion of the conditioned test signal introduced by the analyzer; (d) generating a set of equalization coefficients based on the information representative of the frequency distortion, the set of coefficients corresponding to the selected frequency range; and (e) storing the set of equalization coefficients and the correspondence of the set of coefficients to the selected frequency range; where the determining information representative of frequency distortion of the conditioned test signal introduced by the analyzer includes evaluating variations in the phases and amplitudes of the frequency components of the conditioned test signal.

In some embodiments, the analyzer includes a down-converter and an analog to digital converter, and operates to condition the test signal by transferring the test signal from the selected frequency range to the operating range of the analog to digital converter. the selected frequency range is within the input frequency range of the down converter. The determining information representative of frequency distortion includes determining information representative of frequency distortion introduced by the down-converter.

Some embodiments include for each of a plurality of selected frequency ranges, repeating steps (a)-(e), where the plurality of frequency ranges substantially spans the input frequency range of the down-converter.

Some embodiments include inputting a measurement signal to the analyzer, the analyzer operating to condition the measurement signal; retrieving one of the stored sets of coefficients, the one of the stored sets of coefficients corresponding to a selected frequency range; correcting, based on the retrieved set of coefficient, at least a portion of a frequency distortion introduced into the measurement signal by the analyzer.

In some embodiments, the test signal includes a sequence of N bursts, each burst consisting of three sinusoidal waves with defined frequencies and phases.

In some embodiments, each burst in the sequence of N bursts includes, respectively: a measurement sinusoidal wave with a frequency $f_i$, where i=1, ... N and N>=1, the frequencies $f_i$ substantially spanning the selected frequency range; at least one high reference sinusoidal wave with a frequency $f_H$ near the high end of the selected frequency range; and at least one low reference sinusoidal wave with a frequency $f_L$ near the low end of the selected frequency range.

In some embodiments, each burst occurs over a time interval short enough that any change in phase introduced by carriers within the down-converter is the same for each of the sinusoidal waves.

In some embodiments, the structured test signal includes an initial zero interval, and the determining information representative of frequency distortion of the conditioned test signal introduced by the analyzer includes: identifying a time position of a transition from the initial zero interval to the sequence of bursts; based on the identified time position of the transition, generating time grid information representative of the time positions of bursts in the sequence.

In some embodiments, each of the bursts includes at least one additional type of reference sinusoidal wave.

In some embodiments, the test signal includes a sequence of 3N bursts, each burst being one of three types: measurement bursts with frequencies $f_i$, 1<=i<=N; reference bursts with a frequency $f_L$; reference burst with a frequency $f_H$.

In some embodiments, the bursts in the structured test signal are arranged in such a way that each measurement burst has in the immediate vicinity a reference burst with the frequency $f_L$ as well as a reference burst with the frequency $f_H$.

In some embodiments, the sinusoidal waves are sine waves.

In some embodiments, evaluating the variations in the phases and amplitudes of the frequency components of the conditioned test signal includes: determining information representative of the phase $P_i$ of each measurement sinusoidal wave with the frequency $f_i$; for each burst that contains a measurement sinusoidal wave with the frequency $f_i$, determining information representative of the phases $P_L$, $P_H$ of adjacent reference sinusoidal waves with the frequencies $f_L$, $f_H$; determining information representative of the phase distortion θi at the frequency $f_i$ based on the relation $$\theta i = P_i - P_L - (P_L - P_H)^*(f_i - f_L)/(f_L - f_H).$$

In some embodiments, determining information representative of frequency distortion includes determining information representative of phase distortion of the conditioned signal introduced by the down-converter.

In another aspect, disclosed herein is an apparatus for equalization of a vector/signal analyzer including: a test signal generator; a measurement unit; and a memory unit. During operation in a calibration mode: the test signal generator is configured to provide a structured test signal within a selected frequency range, the test signal including a plurality of frequency components each having an amplitude and phase, and to input the test signal to the analyzer; the measurement unit is configured to: determine information representative of frequency distortion of the test signal introduced by the analyzer, where the determining includes evaluating the variations in the phases and amplitudes of the frequency components of the test signal; and generate a set of equalization coefficients based on the information representative of the frequency distortion, the set of coefficients corresponding to the selected frequency range; and the memory unit is configured to store the at least one set of equalization coefficients and the correspondence of the at least one set of coefficients to the selected frequency range.

In some embodiments, the analyzer includes a down converter and an analog to digital converter, and operates to condition the test signal by transferring the test signal from the selected frequency range to the operating range of the analog to digital converter, the selected frequency range is within the input frequency range of the down converter, and the information representative of frequency distortion includes information representative of frequency distortion introduced by the down-converter.

Some embodiments include a compensation unit. During operation in an operation mode, the compensation unit is configured to: receive a measurement signal, the measurement signal input to and conditioned by the analyzer, receive a set of coefficients from the memory unit, the set of coefficients corresponding to a frequency range which contains the frequency range of the measurement signal, and compensate at least a portion of the frequency distortions introduced to the conditioned measurement signal by the analyzer based on the set of coefficients.

In some embodiments, the compensation unit includes at least one linear filter.

In some embodiments, the test signal includes a sequence of bursts consisting of sinusoidal waves with respective frequencies and phases, and the measurement unit includes a time grid generator unit configured to determine time grid information representative of time locations of the bursts.

In some embodiments, the measurement unit includes a frequency distortion measurement unit configured to determine information representative of frequency distortion of the conditioned test signal introduced by the analyzer based on information representative of the structure of the conditioned test signal and on the time grid information.

In some embodiments, the measurement unit includes a distortions to coefficients transformer unit configured to receive the information representative of the frequency distortions of the conditioned test signal introduced by the analyzer from the frequency distortions measurement unit, generate the set of equalization coefficients based on the information related to the frequency distortions, and send the set of coefficients to the memory unit for storage.

In some embodiments, the bursts contain sinusoidal waves including in-phase and quadrature components.

In some embodiments, the frequency distortion measurement unit includes: a synchronous detector unit configured to determine information related to the amplitudes and phases of the in-phase and quadrature components of the sinusoidal waves; an amplitude and phase calculator unit configured to determine, for a plurality of bursts, information representative of the amplitude and phase of each sinusoidal wave based on the information representative of the amplitudes of the in-phase and quadrature components of the sinusoidal waves and on the time grid information; and a distortions calculator unit configured to calculate information representative of the frequency distortion of the conditioned signal introduced by the analyzer based on the information representative of the sinusoidal waves' amplitudes and phases for each of the plurality of bursts.

In some embodiments, each of the bursts comprise:

a measurement sinusoidal wave with the frequency $f_i$, where i=1, . . . N and N>=1, the frequencies $f_i$ substantially spanning the selected frequency range;

at least one high reference sinusoidal wave with a frequency $f_H$ near the high end of the selected frequency range; and at least one low reference sinusoidal wave $f_L$ with a frequency near the low end of the selected frequency range.

Some embodiments include a switch configured to, in the calibration mode, direct the test signal to an input of the analyzer and, in the operational mode, direct the measurement signal to the input of the analyzer.

In some embodiments, the apparatus includes the analyzer.

Various embodiments may include any of the above described features, either alone or in combination.

DETAILED DESCRIPTION

Figure 1:
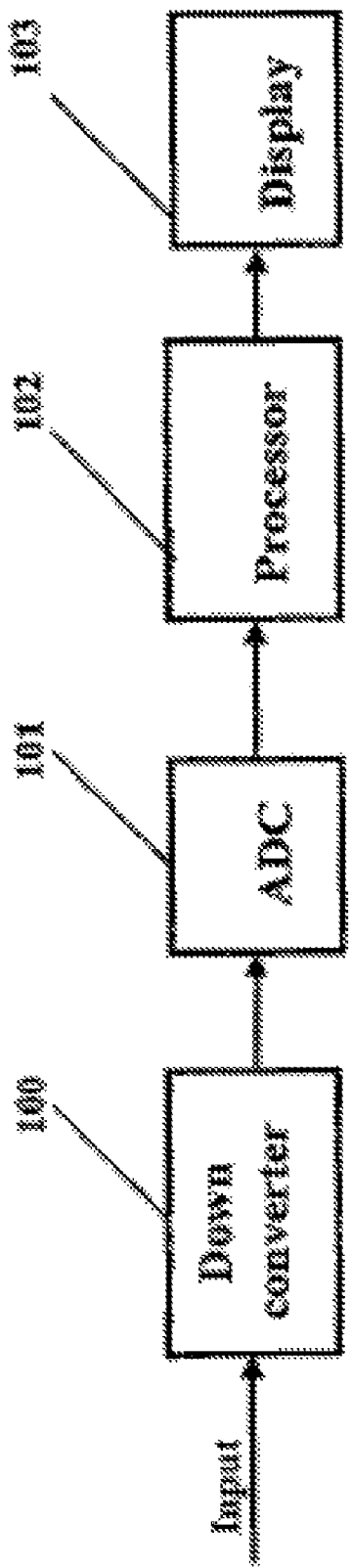
FIG. 1 is a typical block diagram of a prior art vector/signal analyzer.
Figure 2:
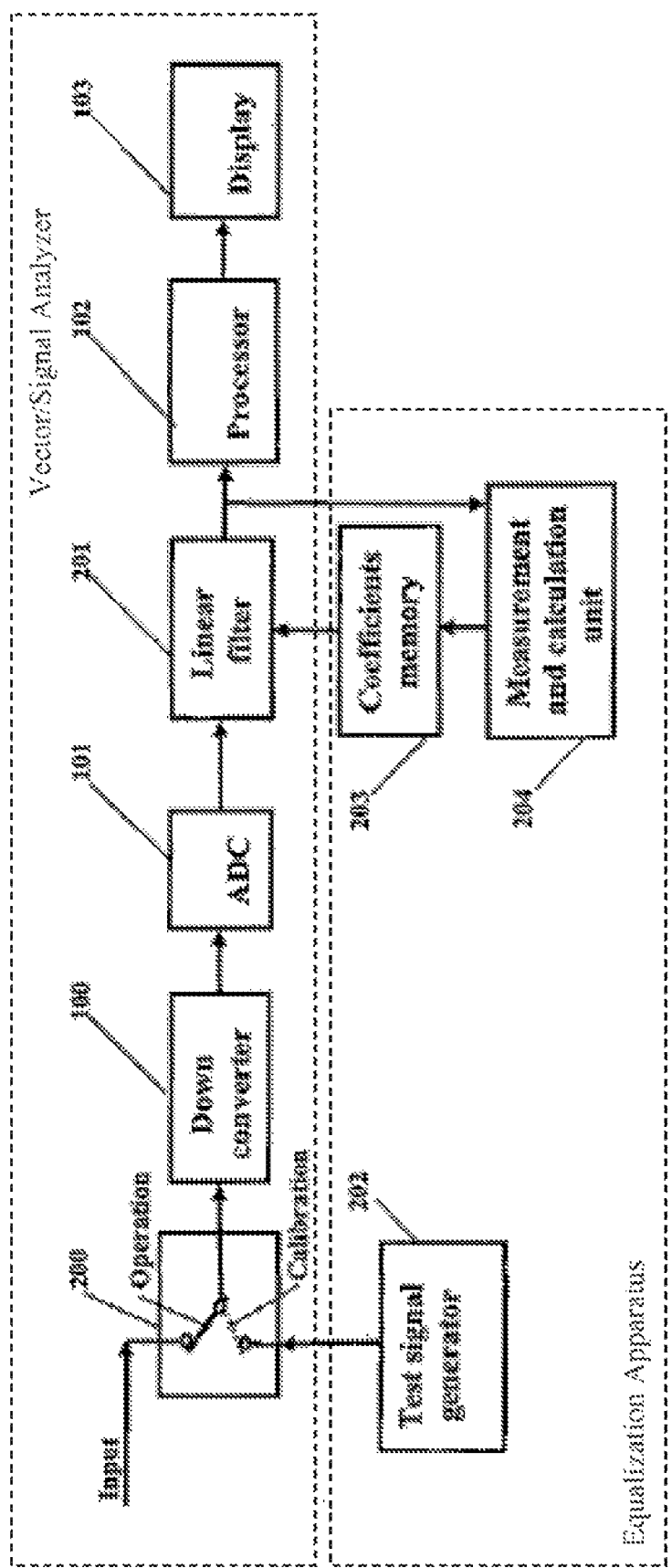
FIG. 2 is a block diagram of a vector/signal analyzer according to the present invention.

A block diagram of a basic embodiment of a vector/signal analyzer according to the present invention is shown at FIG. 2.

The vector/signal analyzer according to the present invention can work in one of two modes: a calibration mode or an operation mode. In the calibration mode the switch 200 connects the input of the down converter 100 to the output of the test signal generator 202. In the operation mode the switch 200 connects the input of the down converter 100 to the input of the vector/signal analyzer.

The down converter 100 transfers the part of the input signal spectrum to the operational frequency range of the analog to digital converter (ADC) 101. The ADC 101 transforms incoming continuous signal into a sequence of digital samples. The output of the ADC 101 is connected to the input of the linear filter 201. The function of the linear filter 201 is to correct the frequency distortion that may emerge in the signal at the output of the ADC 101. The operational features of the linear filter 201 are determined by the equalization coefficients that come to the linear filter 201 from the coefficients memory 203. The processor 102 carries out the necessary analysis of the properties of the signal that comes from the linear filter 201, with the presentation of the received results at the display 103.

The signal from the output of the linear filter 201 goes to the input of the measurement and calculation unit 204 as well. In the calibration mode the measurement and calculation unit 204 performs the measurement of the frequency distortions in the input signal, calculates the change in the equalization coefficients that is necessary to correct the measured distortions and stores the changed coefficients into a coefficients memory 203.

The input signal of the vector/signal analyzer lies in the radio frequencies range (RF range, usually several GHz). The operational range of the analog to digital converter is in the intermediate frequencies range (IF range, usually about a hundred MHz). Since the input frequency range of the vector/signal analyzer is far in excess of the width of the operational range of the analog to digital converter, to receive a complete description of the distortions in the vector/signal analyzer the RF range is divided into chunks. The width of each chunk approximately equals the bandwidth of the IF range. The chunks together cover all the RF range of the vector/signal analyzer. The measurements in the calibration mode and the following calculations are repeated for each chunk. As a result a set of the equalization coefficients is obtained for each chunk, these coefficients being stored in the correspondent region of the coefficients memory.

In the operation mode the input signal of the vector/signal analyzer is connected to the input of the down converter 100. The parameters of the down converter 100 are set up accordingly to the RF range chunk that is occupied by the signal to be analyzed. The equalization coefficients located in the region of the coefficients memory 203 that corresponds to that chunk are loaded into the linear filter 201. The transformation of the signal performed in the linear filter 201 corrects the frequency distortions that have emerged in the down converter.

The test signal generator 202 produces a correspondent test signal for each chunk of the vector/signal analyzer RF input frequency range. There should be a part at the beginning of the test signal that makes it possible to detect the test signal start. It may be, for example, a short zero interval before the first burst.

The test signal is a sequence of sine bursts. The number of the bursts being N, the index i of a burst lies within the limits $1<=i<=N$. Each burst is a sum of at least three sine waves: (1) the measurement sine wave with a frequency $f_i$, (2) the reference sine wave with a frequency $f_L$ that is close to the lowest frequency of the chunk and (3) the reference sine wave with a frequency $f_H$ that is close to the highest frequency of the chunk. The frequencies $f_i$ of the measurement sine waves cover the correspondent chunk.

The number N of the measurement bursts frequencies $f_i$ is chosen to be big enough to provide a complete picture of all substantial details of the frequency distortions in one chunk. All the bursts have the same length and the same amplitude.

The burst length should be long enough to get the measurement process stabilized and make it possible to exclude the burst border parts, where the transit from one burst to another causes phase fluctuations.

The phase of a sine wave in each burst is fixed in relation to the burst borders. For example, the test signal may be generated in such a way that the phase of each sine wave equals zero in the middle of the corresponding burst. The described structure of the test signal establishes a certain relationship between its components. This relationship makes it possible to find the phase distortions in the signal at the output of the analog to digital converter without comparing it to another signal.

The number of reference sine waves in a test signal burst may be more than two, in some cases it elevates the distortions measurement accuracy.

Figure 2A:
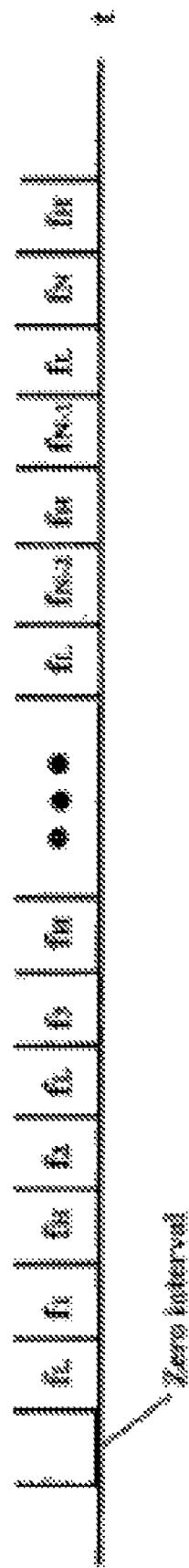
FIG. 2A is a representation of a test signal according to one embodiment of the present invention.

Another embodiment of the present invention is possible, where the test signal, as shown in FIG. 2A, is composed with the use of three types of sine bursts: (1) the measurement bursts with frequencies $f_i$, (2) the reference burst with a frequency $f_L$, and (3) the reference burst with a frequency $f_H$. The bursts in the test signal in that case should be arranged in such a way that each measurement burst has in the immediate vicinity a reference burst with the frequency $f_L$, as well as a reference burst with the frequency $f_H$. Such structure of the test signal permits to increase the sine waves amplitudes but it imposes more heavy demands on oscillator frequencies stability.

Figure 3:
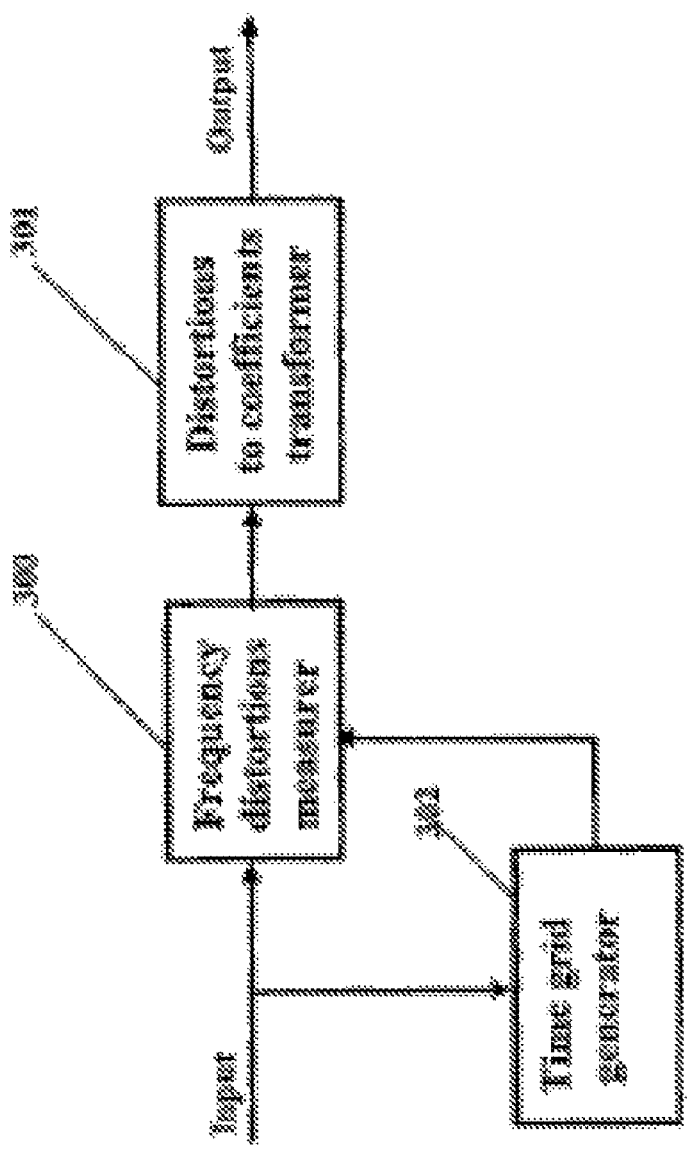
FIG. 3 is a block diagram of a measurement and calculation unit according to the present invention.

A block diagram of the measurement and calculation unit 204 according to the present invention is shown at FIG. 3. The input of the unit is connected to the input of the time grid generator 302 and the input of the phase and amplitude distortions measurer 300. The time grid generator 302 uses the transition from the initial zero interval to the first burst in the test signal to detect the test signal start. Since the length of different bursts is the same, the start detection makes it possible for the time grid generator 302 to generate a time grid that marks the borders of all bursts.

The frequency distortions measurer 300 uses the time grid, received from the time grid generator 302, while measuring the phase and the amplitude of each sine wave in the incoming burst with following calculation of the correspondent frequency distortions.

The collection of the frequency distortions for different frequencies is transferred from the frequency distortions measurer 300 to the distortions to coefficients transformer 301. The transformer 301 calculates the necessary change of the equalization coefficients, for example by the inverse discrete Fourier transform of the frequency distortions received from the measurer 300. The new equalization coefficients are found as a convolution of the former equalization coefficients and the calculated necessary change. The new equalization coefficients are stored in the coefficients memory 203, in the region that corresponds to the analyzed chunk of the vector/signal analyzer RF range.

Figure 4:
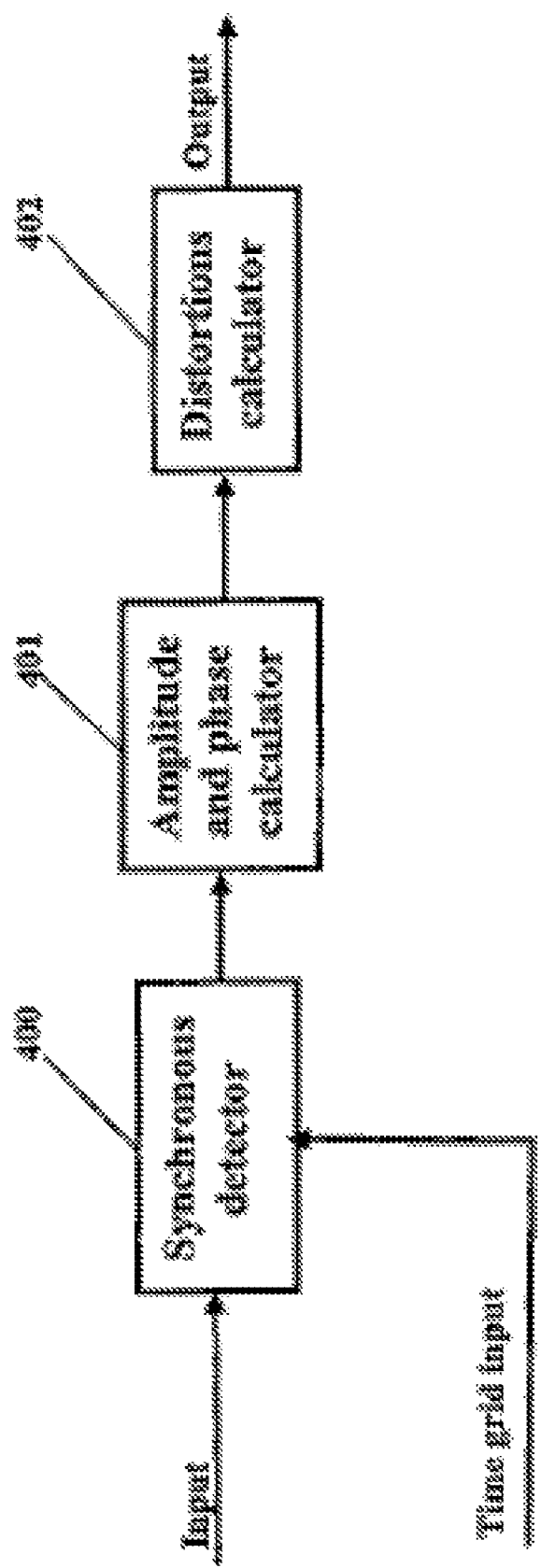
FIG. 4 is a block diagram of a phase and amplitude distortions measurer according to the present invention.

A block diagram of the frequency distortions measurer 300 according to the present invention is shown at FIG. 4. The synchronous detector 400 processes each burst of the test signal inside the borders designated by the time grid. It separates out the in-phase I and the quadrature Q components of each sine wave in the burst, the components being calculated in relation to the sine wave of the correspondent frequency with a zero phase in the middle of the burst. Then the values I and Q of the in-phase and the quadrature components are passed over to the amplitude and phase calculator 401.

The amplitude A and phase P of a sine wave in a burst are calculated in the calculator 401 according to the equations:

$$A=\sqrt{(I^2+Q^2)}; \quad (1)$$

$$P=\tan^{-1}(Q/I); \quad (2)$$

In the distortions calculator 402 the amplitude A and phase P are used to calculate the frequency distortions. The amplitude frequency distortions are calculated in the usual way by comparing the amplitudes of different sine waves in a burst. The calculation of the phase frequency distortions requires a more sophisticated approach.

The frequency instability of local oscillators in the down converter 100 results in the permanent change of the carrier phases. The phase of a carrier in a signal frequency conversion is added to the phases of all signal frequency components alike. Because of the inevitable errors in test signal start detection and because of the frequency instability of the analog to digital converter clock oscillator the bursts borders specified by the time grid from grid generator 303 differ from real bursts borders with time error $\tau$. Therefore the signal component with the frequency f in a burst is phase shifted by a value $f*\tau$. These two effects cause the phases P of sine waves at the output of the amplitude and phase calculator 401 to have random values, so that they cannot be used for distortions calculations directly.

The test signal according to present invention has such a structure that an arbitrary measurement sine wave with a frequency $f_i$ and two adjacent reference sine waves with frequencies $f_L$ and $f_H$ are located in the same short time interval. The initial phases of the carriers in the down converter for all practical purposes do not vary during such short time. Therefore the phases of the mentioned three sine waves are increased in the down converter by the same value $\theta$. In a similar manner the burst borders time error $\tau$ is the same for all three sine waves. Since in all bursts of the test signal the sine waves phases initially equal zero in the middle of the burst, the phase $P_i$ of the measurement burst with a frequency $f_i$, the phase $P_L$ of the reference burst with a frequency $f_L$ and the phase $P_H$ of the reference burst with a frequency $f_H$ in the middle of the burst at the input of the measurement and calculation unit 204 satisfy next set of equations:

$$P_i=\theta+f_i*\tau+\theta_i; \quad (4)$$

$$P_L=\theta+f_L*\tau+\theta_L; \quad (5)$$

$$P_H=\theta+f_H*\tau+\theta_H; \quad (6)$$

Here the symbols $\theta_i$, $\theta_L$ and $\theta_H$ are total phase shifts in the filters of the down converter at the frequencies $f_i$, $f_L$ and $f_H$ respectively. By combining the equations (4), (5) and (6) with the simultaneous elimination of the variables $\theta$ and $\tau$, by solving the resulting equation for the phase shift $\theta_i$ and by dropping the terms in the solution that do not effect the quality of the signal transmission the final relation may be obtained:

$$\theta_i=P_i-P_L-(P_L-P_H)*(f_i-f_L)/(f_L-f_H) \quad (7)$$

The distortions calculator 402 calculates the phase frequency distortions of the vector/signal analyzer from the phases at the output of the amplitude and phase calculator 401 using the equation (7).

One or more or any part thereof of the equalization techniques described above can be implemented in computer hardware or software, or a combination of both. The method can be implemented in computer programs using standard programming techniques following the method and figures described herein. Moreover, the program can run on dedicated integrated circuits preprogrammed for that purpose.

A number of the details of an exemplary implementation of the present invention were described above. It should be apparent to those skilled in the art that various modifications are possible without departing from the principles of the present invention. Accordingly, such modifications are understood to be within the scope of the following claims.

Although the examples above describe the use of bursts which include, it is to be understood that any suitable sinusoidal wave may be used. As used herein, the term "sinusoidal wave" refers to any wave with a waveform whose shape does not deviate from that of a sine wave in an amount sufficient to inhibit the proper functioning of the analyzer/equalizer for the application at hand.

What is claimed is:

1. A method of equalization of a vector/signal analyzer, the vector signal/analyzer including a linear filter in a signal path between an input terminal and an output terminal, wherein the linear filter is responsive to applied coefficients to correct frequency distortion, comprising:

(a) providing a structured test signal within a selected frequency range, the structured test signal comprising a plurality of frequency components each having a respective amplitude and phase;

(b) inputting the test signal to the analyzer; the analyzer operating to condition the test signal;

(c) determining information representative of frequency distortion of the conditioned test signal introduced by the analyzer;

(d) generating a set of equalization coefficients based on the information representative of the frequency distortion, the set of coefficients corresponding to the selected frequency range;

(e) storing the set of equalization coefficients and the correspondence of the set of coefficients to the selected frequency range; and (f) applying the stored coefficients to the linear filter;

wherein the determining information representative of frequency distortion of the condition test signal introduced by the analyzer comprises evaluating variations in the phases and amplitudes of the frequency components of the conditioned test signal.

2. The method of claim 1, wherein:

the analyzer includes a down-converter and an analog to digital converter, and operates to condition the test signal by transferring the test signal from the selected frequency range to the operating range of the analog to digital converter, and the selected frequency range is within the input frequency range of the down converter; and the determining information representative of frequency distortion comprises determining information representative of frequency distortion introduced by the down-converter.

3. The method of claim 2, further comprising:

for each of a plurality of selected frequency ranges, repeating steps (a)-(f), wherein the plurality of frequency ranges substantially spans the input frequency range of the down-converter.

4. The method of claim 3, further comprising:

inputting a measurement signal to the analyzer, the analyzer operating to condition the measurement signal;

retrieving one of the stored sets of coefficients, the one of the stored sets of coefficients corresponding to a selected frequency range;

correcting, based on the retrieved set of coefficient, at least a portion of a frequency distortion introduced into the measurement signal by the analyzer.

5. The method of claim 2, wherein
the test signal comprises a sequence of N bursts, each burst consisting of three sinusoidal waves with defined frequencies and phases.

6. The method of claim 5, wherein each burst in the sequence of N bursts comprises, respectively:
a measurement sinusoidal wave with a frequency $f_i$, where $i=1, \ldots N$ and $N>=1$, the frequencies $f_i$ substantially spanning the selected frequency range;
at least one high reference sinusoidal wave with a frequency $f_H$ near the high end of the selected frequency range; and
at least one low reference sinusoidal wave with a frequency $f_L$ near the low end of the selected frequency range.

7. The method of claim 6, wherein each burst occurs over a time interval short enough that any change in phase introduced by carriers within the down-converter is the same for each of the sinusoidal waves.

8. The method of claim 6, wherein each of the bursts comprises at least one additional type of reference sinusoidal wave.

9. The method of claim 7, wherein the evaluating the variations in the phases and amplitudes of the frequency components of the conditioned test signal comprises:
determining information representative of the phase $P_i$ of each measurement sinusoidal wave with the frequency $f_i$;
for each burst that contains a measurement sinusoidal wave with the frequency $f_i$, determining information representative of the phases $P_L$, $P_H$ of adjacent reference sinusoidal waves with the frequencies $f_L$, $f_H$;
determining information representative of the phase distortion $\theta i$ at the frequency $f_i$ based on the relation $$\theta i = P_i - P_L - (P_L - P_H) * (f_i - f_L)/(f_L - f_H).$$

10. The method of claim 5, wherein the structured test signal comprises an initial zero interval, and the determining information representative of frequency distortion of the conditioned test signal introduced by the analyzer comprises:
identifying a time position of a transition from the initial zero interval to the sequence of bursts;
based on the identified time position of the transition, generating time grid information representative of the time positions of bursts in the sequence.

11. The method of claim 5, wherein the sinusoidal waves are sine waves.

12. The method of claim 2, wherein
the test signal comprises a sequence of 3N bursts, each burst being one of three types:
measurement bursts with frequencies $f_i$, $1<=i<=N$;
reference bursts with a frequency $f_L$;
reference burst with a frequency $f_H$.

13. The method of claim 12, wherein the bursts in the structured test signal are arranged in such a way that each measurement burst has in the immediate vicinity a reference burst with the frequency $f_L$ as well as a reference burst with the frequency $f_H$.

14. The method of claim 2, wherein the determining information representative of frequency distortion comprises determining information representative of phase distortion of the conditioned signal introduced by the down-converter.

15. An apparatus for equalization of the vector/signal analyzer, the vector signal analyzer including a linear filter in a signal path between an input terminal and an output terminal wherein the linear filter is responsive to applied coefficients to correct frequency distortion, comprising:
a test signal generator;
a measurement unit; and
a memory unit;
wherein, during operation in a calibration mode:
the test signal generator is configured to provide a structured test signal with a selected frequency range, test signal comprising a plurality of frequency components each having an amplitude and phase, and to input the test signal to the analyzer;
the measurement unit is configured to:
determine information representative of frequency distortion of the test signal introduced by the analyzer, wherein the determine step comprises evaluating variations in the phases and amplitudes of the frequency components of the test signal; and
generate a set of equalization coefficients based on information representative of the frequency distortion, the set of coefficients corresponding to the selected frequency range; and
the memory unit is configured to store the at least one set of equalization coefficients and the correspondence of the at least one set of coefficients to the selected frequency range, and to apply the stored coefficients to the linear filter.

16. The apparatus of claim 15, wherein
the analyzer includes a down converter and an analog to digital converter, and operates to condition the test signal by transferring the test signal from the selected frequency range to the operating range of the analog to digital converter,
the selected frequency range is within the input frequency range of the down converter, and
the information representative of frequency distortion comprises information representative of frequency distortion introduced by the down-converter.

17. The apparatus of claim 16, further comprising a compensation unit;
wherein, during operation in an operation mode, the compensation unit is configured to:
receive a measurement signal, the measurement signal input to and conditioned by the analyzer,
receive a set of coefficients from the memory unit, the set of coefficients corresponding to a frequency range which contains the frequency range of the measurement signal, and
compensate at least a portion of the frequency distortions introduced to the conditioned measurement signal by the analyzer based on the set of coefficients.

18. The apparatus of claim 17, wherein the compensation unit comprises at least one linear filter.

19. The apparatus of claim 17, further comprising a switch configured to, in the calibration mode, direct the test signal to an input of the analyzer and, in the operational mode, direct the measurement signal to the input of the analyzer.

20. The apparatus of claim 16, wherein the test signal comprises a sequence of bursts consisting of sinusoidal waves with respective frequencies and phases, and wherein the measurement unit comprises a time grid generator unit configured to determine time grid information representative of time locations of the bursts.

21. The apparatus of claim 20, wherein the measurement unit comprises a frequency distortion measurement unit configured to determine information representative of frequency distortion of the conditioned test signal introduced by the analyzer based on information representative of the structure of the conditioned test signal and on the time grid information.

22. The apparatus of claim 21, wherein the measurement unit comprises a distortions to coefficients transformer unit configured to receive the information representative of the frequency distortions of the conditioned test signal introduced by the analyzer from the frequency distortions measurement unit, generate the set of equalization coefficients based on the information related to the frequency distortions, and
send the set of coefficients to the memory unit for storage.

23. The apparatus of claim 21, wherein the bursts contain sinusoidal waves comprising in-phase and quadrature components.

24. The apparatus of claim 23, wherein the frequency distortion measurement unit comprises:

a synchronous detector unit configured to determine information related to the amplitudes and phases of the in-phase and quadrature components of the sinusoidal waves;
an amplitude and phase calculator unit configured to determine, for a plurality of bursts, information representative of the amplitude and phase of each sinusoidal wave based on the information representative of the amplitudes of the in-phase and quadrature components of the sinusoidal waves and on the time grid information; and
a distortions calculator unit configured to calculate information representative of the frequency distortion of the conditioned signal introduced by the analyzer based on the information representative of the sinusoidal waves' amplitudes and phases for each of the plurality of bursts.

25. The apparatus of claim 20, wherein each of the bursts comprise:

a measurement sinusoidal wave with the frequency $f_i$, where i=1, ... N and N>=1, the frequencies $f_i$ substantially spanning the selected frequency range;
at least one high reference sinusoidal wave with a frequency $f_H$ near the high end of the selected frequency range; and
at least one low reference sinusoidal wave $f_L$, with a frequency near the low end of the selected frequency range.

26. The apparatus of claim 15, further comprising the analyzer.

27. A vector/signal analyzer, comprising:

(a) an input device for selectively passing one of an input RF signal and a test RF signal applied thereto to an input terminal,
(b) a down-converter coupled to receive the passed RF signal from the input terminal and down convert the received RF signal to an intermediate frequency IF signal,
(c) an analog-to-digital converter (ADC) coupled to receive the IF signal and convert the IF signal to a corresponding digital signal,
(d) a linear filter coupled to receive the digital signal and adapted to provide a filtered digital signal pursuant to a linear filter, wherein the linear filter is adapted in response is to applied equalization coefficients to correct frequency distortion in the digital signal,
(e) a processor for processing the filtered digital signal to provide a processed signal, and
(f) a display for displaying the processed signal.

28. The vector/signal analyzer of claim 27, further comprising:

(g) a test signal generator for providing a structured test signal within a selected frequency range, a structured test signal comprising a plurality of components, each having a respective amplitude and phase,
(h) a test activator for selectively applying the structured test signal to the input terminal,
(i) a measurement unit responsive to a signal from the linear filter along the signal path to determine information representative of frequency distortion of the structured test signal applied the input terminal, and evaluating variations in the phases and amplitudes of the frequency components of the signal from the linear filter,
(j) a calculation unit responsive to the frequency distortion information to generate a set of equalization coefficients based on said information,
(k) a coefficient memory for storing a set of equalization coefficients, and
(l) a memory unit for storing the equalization coefficients and for applying the stored coefficients to the linear filter, thereby effecting equalization of the vector/signal analyzer.

29. The vector/signal analyzer of claim 28, wherein the test signal comprises:

a sequence of N bursts, each burst consisting of three sinusoidal waves with defined frequencies and phases.

30. The vector/signal analyzer of claim 29, wherein each burst in the sequence of N bursts comprises, respectively:

a measurement sinusoidal wave with a frequency $f_i$, where i=1, ... N and N>=1, the frequencies $f_i$ substantially spanning the selected frequency range;
at least one high reference sinusoidal wave with a frequency $f_H$ near the high end of the selected frequency range; and
at least one low reference sinusoidal wave with a frequency $f_L$ near the low end of the selected frequency range.

31. The vector/signal analyzer of claim 30, wherein each burst occurs over a time interval short enough that any change in phase introduced by carriers within the down-converter is the same for each of the sinusoidal waves.

32. The vector/signal analyzer of claim 30, wherein each of the bursts comprises at least one additional type of reference sinusoidal wave.

33. The vector/signal analyzer of claim 29, wherein the structured test signal comprises an initial zero interval, and the determining information representative of frequency distortion of the conditioned test signal introduced by the analyzer comprises:

identifying a time position of a transition from the initial zero interval to the sequence of bursts;
based on the identified time position of the transition, generating time grid information representative of the time positions of bursts in the sequence.

34. The vector/signal analyzer of claim 28, wherein the test signal comprises a sequence of 3N bursts, each burst being one of three types:
measurement bursts with frequencies $f_i$, 1<=i<=N;
reference bursts with a frequency $f_L$;
reference burst with a frequency $f_H$.

35. The vector/signal analyzer of claim 34, wherein the bursts in the structured test signal are arranged in such a way that each measurement burst has in the immediate vicinity a reference burst with the frequency $f_L$ as well as a reference burst with the frequency $f_H$.

* * * * *